(12) United States Patent
Yang

(10) Patent No.: US 6,306,711 B1
(45) Date of Patent: Oct. 23, 2001

(54) METHOD OF FABRICATING A HIGH-VOLTAGE LATERAL DOUBLE DIFFUSED METAL OXIDE SEMICONDUCTOR

(75) Inventor: Sheng-Hsing Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/185,398

(22) Filed: Nov. 3, 1998

(51) Int. Cl.[7] ................................................. H01L 21/336
(52) U.S. Cl. .......................... 438/286; 438/298; 438/307; 438/454
(58) Field of Search ..................................... 438/307, 298, 438/454, FOR 192, 286

(56) References Cited

U.S. PATENT DOCUMENTS 5,917,222 * 6/1999 Smayling et al. .
5,939,753 * 8/1999 Ma et al. .
6,087,232 * 7/2000 Kim et al. .
6,160,289 * 12/2000 Kwon et al. .

* cited by examiner

Primary Examiner—George Fourson

(57) ABSTRACT

A high-voltage lateral double-diffused metal oxide semiconductor has a field metal plate or an electrical field shield conductive layer, which is electrically coupled with a gate or a gate conductive layer that lies over a field oxide layer. A wire bridges over the field oxide layer and thus decreases the strength of the electrical field. The field oxide layer under the crossing wire has no drift region below. Therefore, the electrical field crowding effect does not occur at the junction between the drift region and the channel. In addition, there is no wire over the field oxide layer having the drift region below. Thus, the components can work normally. In this way, the strength of electrical field between the drift region and the channel decreaes and the breakdown voltage of high-voltage lateral double-diffused metal oxide semiconductor increases.

26 Claims, 5 Drawing Sheets

US 6,306,711 B1

METHOD OF FABRICATING A HIGH-VOLTAGE LATERAL DOUBLE DIFFUSED METAL OXIDE SEMICONDUCTOR

BACKGROUND OF THE INVENTION

1. Field of the Invention

The present invention relates to a semiconductor fabricating method. More particularly, the present invention relates to a method of fabricating high-voltage lateral double-diffused metal oxide semiconductor (LDMOS).

2. Description of the Related Art

Due to the increasing number of semiconductor elements incorporated in integrated circuits, the size of metal oxide semiconductor (MOS) components needs to be decreased. Accordingly, as the channel length of the MOS is decreased, the operating speed is increased. However, there is an increased likelihood of a problem, referred to as "short channel effect", caused by the reduced channel length. If the voltage level is fixed, according to the equation of electrical field =electrical voltage/channel length, as the channel length is shortened, the strength of electrical field is increased. Thus, as the strength of electrical field increases, energy of electron increases and electrical breakdown is likely to occur.

In general, a high voltage is on an order of about 8 vol or above. A MOS that can be operated under high voltage is called a high-voltage MOS. An isolation layer and a drift region below the isolation layer are used to increase the distance between the source/drain and the gate electrode in the high-voltage MOS. Thus, the MOS is able to work normally under the high voltage.

FIG. 1 is a schematic, cross-sectional view of a conventional LDMOS.

In FIG. 1, a conventional LDMOS including a P-type silicon substrate 100, a field oxide layer 101, a gate oxide layer 102, a gate layer 103, a N⁺drain region 104, an N⁻drift region 105, an N⁺source region 106, a P-doped region 107, and a P⁺-doped region 108.

In the conventional LDMOS, the drift region 105 is under the crossing wire 109. While operating the conventional LDMOS under high voltage, high electrical field crowding occurs at the junction 110 between the drift region 105 and the channel. Thus, the breakdown voltage is decreased.

SUMMARY OF THE INVENTION

Accordingly, the present invention provide a method for fabricating a high-voltage LDMOS that decreases the strength of the electrical field at the junction between the drift region and the channel.

In the high-voltage LDMOS of the present invention, a field metal plate or an electrical field shield conductive layer, which is electrically coupled with a gate or a gate conductive layer, lies on a field oxide layer. A wire bridges over the field oxide layer. It thus decreases the strength of the electrical field. The field oxide layer under the crossing wire has no drift region below. Thus the electrical field crowding effect does not occur at the junction between drift region and channel. In addition, there is no wire over the field oxide layer having the drift region below. The strength of electrical field between the drift region and the channel decreases and the breakdown voltage of high-voltage lateral double-diffused metal oxide semiconductor increase, which makes the devices work normally.

It is to be understood that both the foregoing general description and the following detailed description are exemplary, and are interested to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2 and 3 are layouts of the invention. Part (I) of each figure is the schematic, cross-sectional view of FIGS. 2 or 3 taken along line I—I. Part (II) of each figure is the schematic, cross-sectional view of FIGS. 2 or 3 taken along line II—II.

DESCRIPTION OF THE PREFERRED EMBODIMENT

Figure 1:
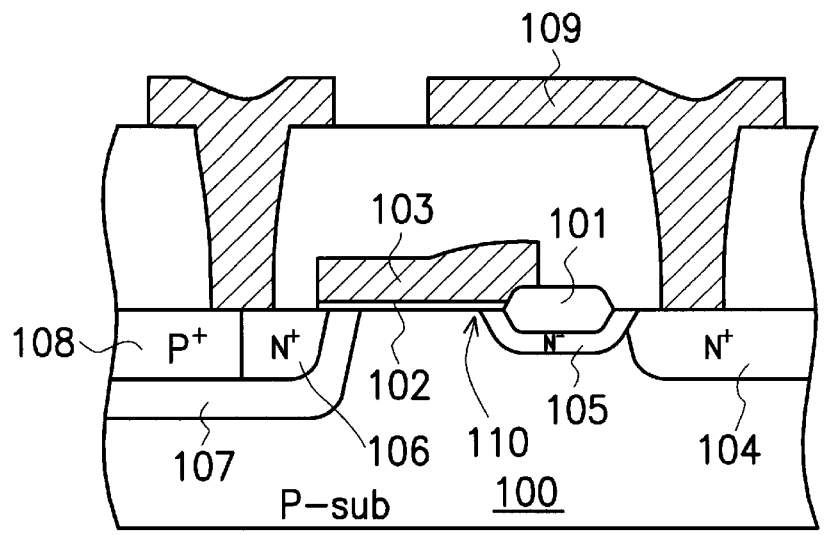
FIG. 1 is a schematic, cross-sectional view of a conventional LDMOS.

Reference will now be made in detail to the present preferred embodiments of the invention, examples of which are illustrated in the accompanying drawings. Wherever possible, the same reference numbers are used in the drawings and the description to refer to the same or like parts.

Figure 2:
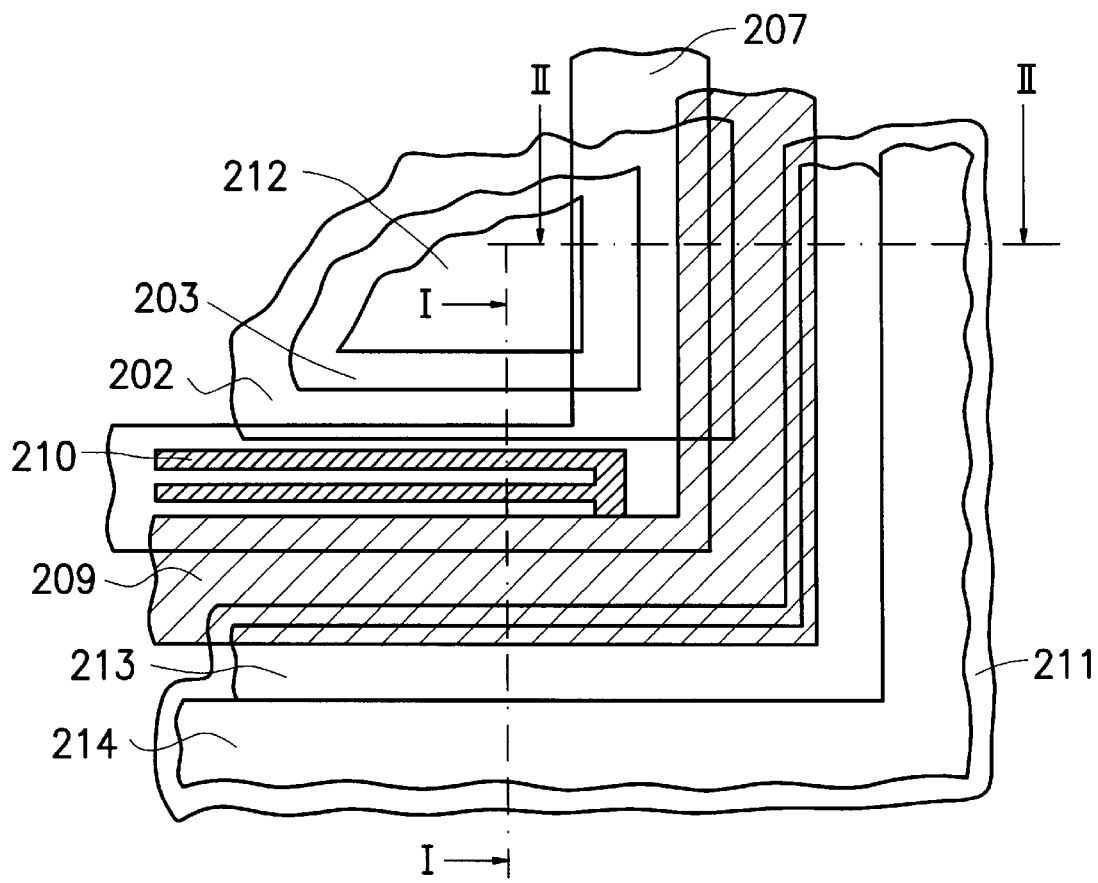
FIG. 2 is a top-view of a high-voltage LDMOS layout according to one preferred embodiment of the invention.
Figure 3:
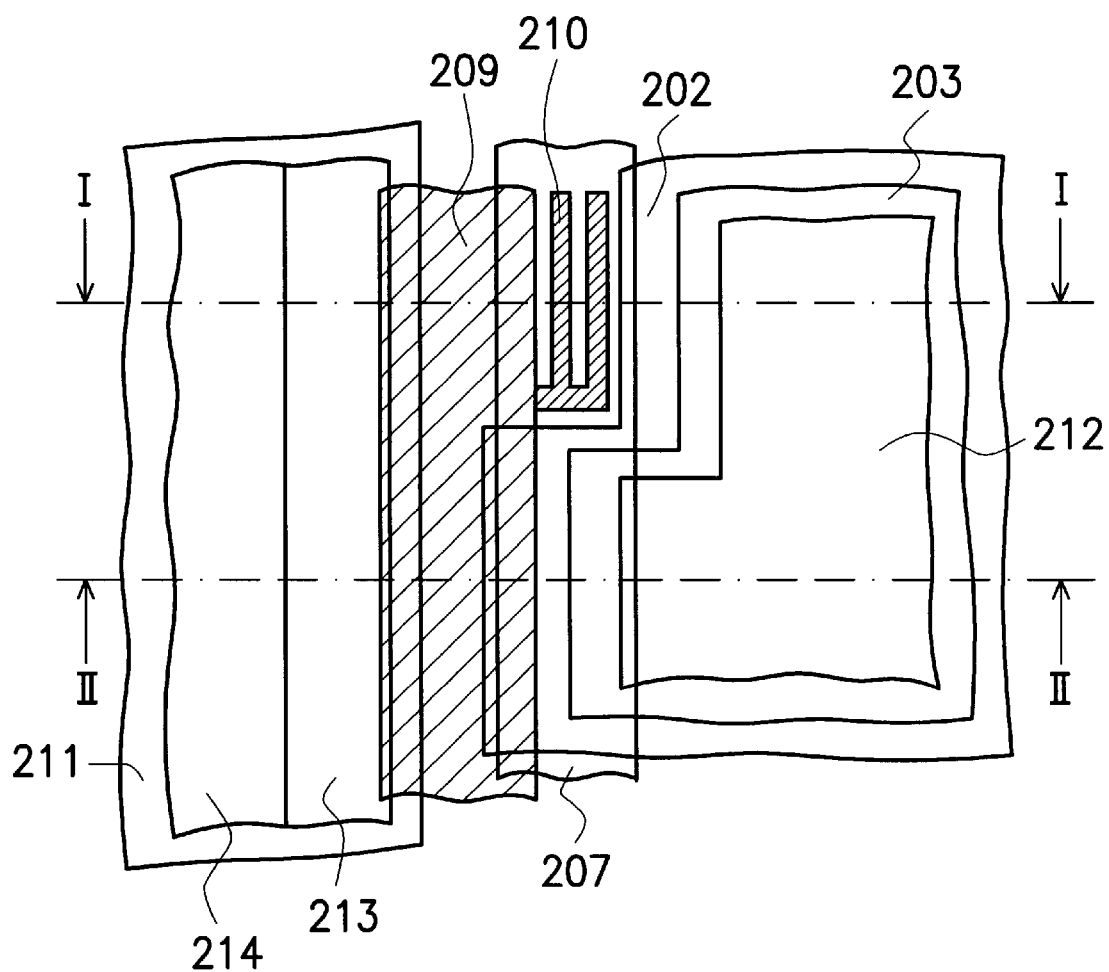
FIG. 3 is a top-view of a high-voltage LDMOS layout according to the other preferred embodiment of the invention.

FIG. 2 is a top-view of a high-voltage LDMOS layout according to one preferred embodiment of the invention FIG. 3 is a top-view of a high-voltage LDMOS layout according to the other preferred embodiment of the invention.

FIGS. 4A through 4E are schematic, cross-sectional views showing a fabricating process of a high-voltage LDMOS according to one preferred embodiment of the invention. Both FIGS. 2 and 3 are layouts of the invention. Part (I) of each figure is the schematic, cross-sectional view of FIGS. 2 or 3 taken along line I—I. Part (II) of each figure is the schematic, cross-sectional view of FIGS. 2 or 3 taken along line II—II.

Reference is made to FIGS. 2 and 4A through 4E or FIGS. 3 and 4A through 4E, which explains the steps in a process for fabricating a high-voltage LDMOS according to one preferred embodiment of this invention.

Figure 4A:
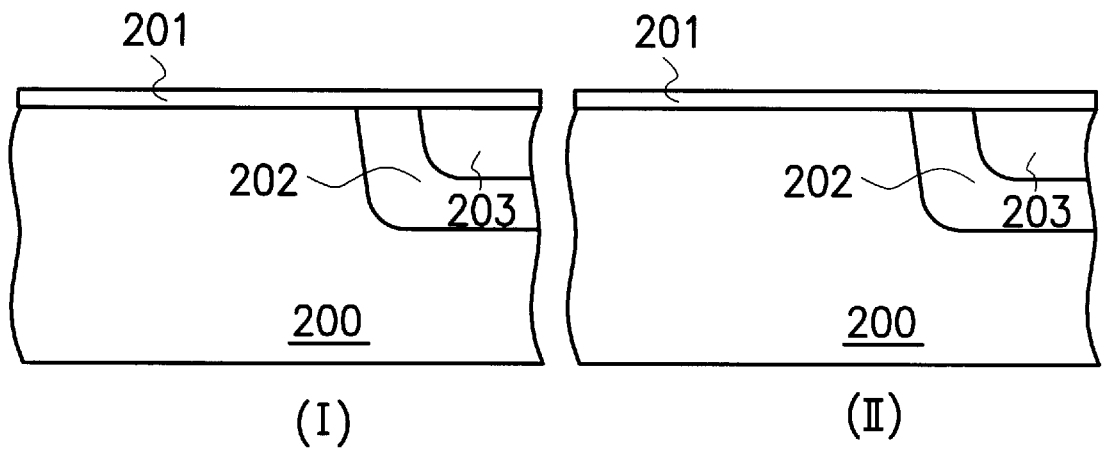
FIGS. 4A through 4E are schematic, cross-sectional views showing a fabricating process of a high-voltage LDMOS according to one preferred embodiment of the invention. Both

In FIG. 4A, a first oxide layer 201 is formed on a semiconductor substrate 200. The substrate 200 can be a P-type silicon substrate or a P-well, for example. An N-type ion implantation is performed to form a first N-well 202 in the substrate 200. A first-type impurity is driven in. A second N-type ion implantation is performed to form a second N-well 203 in the first N-well 202. Then, a second-type impurity is driven in. In the process, the second N-type ion implantation and the second-type impurity driven-in step can be omitted. In general, the ion concentration of the second N-well 203 is higher than the ion concentration of the first N-well 202.

Figure 4B:
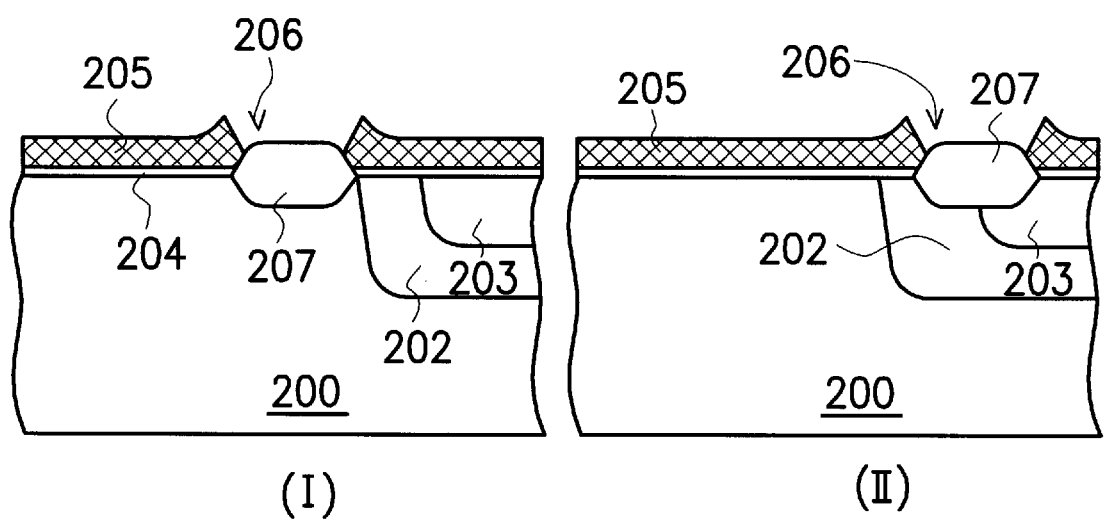

In FIG. 4B, the first oxide layer 201 is removed and a pad oxide layer 204 is formed on the substrate 200. A silicon nitride (Si$_3$N$_4$) layer 205 is formed on the pad oxide layer 204. An opening 206 is formed in the silicon nitride layer 205 and the pad oxide layer 204 to expose a portion of the substrate 200, the first N-well 202, and the second N-well 203. A field oxidation is performed to form a field oxide layer 207 in the opening 206. A portion of the field oxide layer 207 is located on the substrate 200 and the other portion is located on the first N-well 202 and the second N-well 203.

Figure 4C:
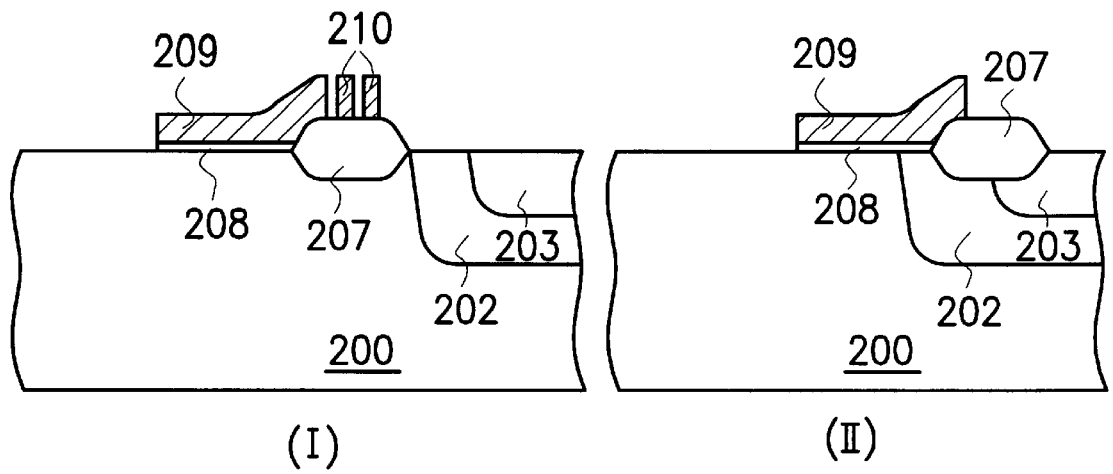

In FIG. 4C, the silicon nitride layer 205 and the pad oxide layer 204 are removed. A gate oxide layer 208, a gate conductive layer 209, and a conductive layer, such as an electrical field shield conductive layer 210, are formed in sequence over the substrate 200. A portion of gate conductive layer 209 is located on the field oxide layer 207 and the other portion is one the substrate 200. The electrical field shield conductive layer 210 and the gate conductive layer 209 are electrically coupled and formed from the same structural layer. The electrical field shield conductive layer 210 is located on the field oxide layer 207 without the first N-well 202 and the second N-well 203 below. The electrical field shield layer 210 is used as an electrical field shield under high voltage.

Figure 4D:
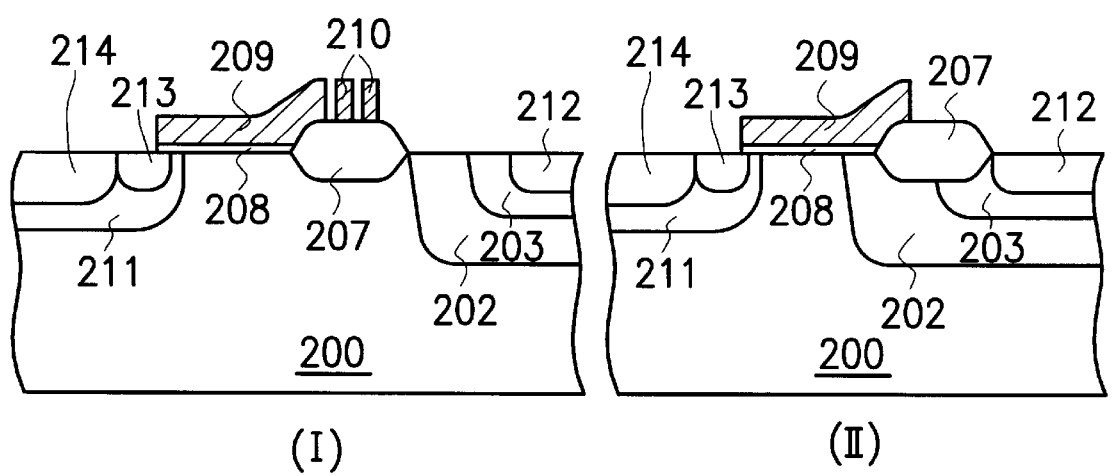

In FIG. 4D, a P-type ion implantation is performed and a third-type impurity is driven in to form a P-doped region 211 in the substrate 200. A portion of P-doped layer 211 is formed below the gate conductive layer 209. A third N-type ion implantation is performed to form an N$^+$ drain region 212 in the second N-well 203 and a N$^+$ source region 213 in the P-doped region 214. A second P-type ion implantation is performed to form a P$^+$-doped region 214 in the P doped region 211. The P$^+$-doped layer 214 is beside the N$^+$ source region 213. An annealing step is performed.

Figure 4E:
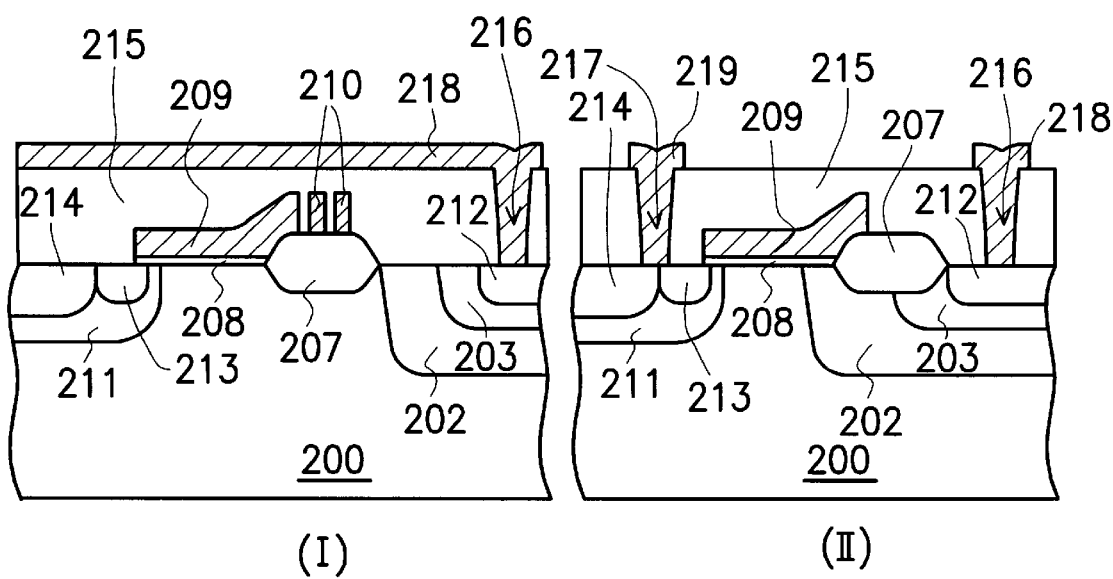

In FIG. 4E, an isolation layer 215, which has a second opening 216 and a third opening 217 therein, is formed over the substrate 200. The second opening 216 exposes the N$^+$ drain region 212 and the third opening 217 exposes N$^+$ source region 213. A first conductive layer 218 and a second conductive layer 219 are formed over the isolation layer 215 and the substrate 200. The first conductive layer 218 and the second conductive layer 219 are formed from the same structural layer and used as wires. The second opening 216 is filled by the first conductive layer 218. The first conductive layer 218 bridges over the field oxide layer 207, which has the electrical field shield conductive layer 210 thereon but without the N-well 202 below. The third opening 217 is filled by the second conductive layer 219. The field oxide layer 207, which is under the crossing wire, such as the first conductive layer 218, has no drift region, such as N-well 202, below. Thus, the electrical field crowding effect does not occur at the junction between drift region and channel. Therefore, the components can work normally.

The LDNMOS above describes one preferred embodiment of the invention. The invention also provides a LDPMOS. Those skilled in the art will be able to see that the LDPMOS can be completed according to the invention by changing the N-well to a P-well, the N$^+$ source/drain region to a P$^+$ source-drain region, the P$^-$ doped region to an N$^-$ doped region, and the P$^+$ doped region to an N$^+$ doped region.

The present invention has several field metal plates or the electrical field shield conductive layer 210 electrically coupled with the gate, such as the gate conductive layer 209. Thus, it decreases the strength of electrical field. Furthermore, the field oxide layer 207 that the wire bridges over has no drift region, such as the N-well 202, below. Therefore, electrical crowding does not happen at the junction between the drift region, such as the N-well 202, and the channel.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a high-voltage lateral double-diffused metal oxide semiconductor, wherein the method comprises:

providing a substrate having a first oxide layer thereon;

performing a first N-type ion implantation to form a first N-well in the substrate;

performing a second N-type ion implantation to form a second N-well in the substrate;

removing the first oxide layer;

forming a pad oxide layer and a silicon nitride layer over the substrate;

forming a first opening in the pad oxide layer and the silicon nitride layer, wherein the first opening exposes a portion of the substrate, the first N-well, and the second N-well;

performing a field oxidation to form a field oxide layer in the opening, wherein a portion of the field oxide is located on the substrate and the other portion is located on the first N-well and the second N-well;

removing the silicon nitride layer and the pad oxide layer;

forming a gate oxide layer, a gate conductive layer, and electrical field shield conductive layer over the substrate, wherein a portion of the gate conductive layer is located on the field oxide layer, the electrical field shield conductive layer is electrically coupled with the gate conductive layer and is formed from the same structural layer as the gate conductive layer, the electrical field shield conductive layer is used as an electrical field shield under high voltage, and the electrical field shield conductive layer is located on the field oxide layer without the first N-well and the second N-well below;

performing a first P-type ion implantation to form a P-doped region in the substrate, wherein a portion of the P-doped layer is below the gate conductive layer;

performing a third N-type ion implantation to form an N$^+$ drain region in the second N-well and an N$^+$ source region in the P-doped region;

performing a second P-type ion implantation to form a P$^+$-doped layer in the P-doped layer, wherein the P$^+$-doped layer is beside the N$^+$ source region;

forming an isolation layer having a second opening and a third opening therein over the substrate; and forming a first conductive layer and a second conductive layer over the substrate, wherein the first conductive layer and the second conductive layer are formed from the same structural layer, the second opening if filled by the first conductive layer, and the first conductive layer bridges over the field oxide layer having an electrical field shield conductive thereon and without the first N-well below, and the third opening if filled by the second conductive layer.

2. The method of claim 1, wherein the substrate is one selected from the group consisting of a P-type silicon substrate and a P-well.

3. The method of claim 1, wherein the step of the first N-type ion implantation further includes driving in a first-type impurity.

4. The method of claim 1, wherein the step of the second N-type ion implantation further includes driving in a second-type impurity.

5. The method of claim 1, wherein the step of the first P-type ion implantation further includes driving in a third-type impurity.

6. The method of claim 1, wherein the step of the second P-type ion implantation further includes annealing.

7. The method of claim 1, wherein the gate conductive layer and the electrical field shield conductive layer include a doped polysilicon layer.

8. A method of fabricating a high-voltage lateral double-diffused metal oxide semiconductor, wherein the method comprises:

providing a substrate having a first oxide layer thereon;

performing an N-type ion implantation to form an N-well in the substrate;

removing the first oxide layer;

forming a pad oxide layer and a silicon nitride layer over the substrate;

forming a first opening in the silicon nitride layer and the pad oxide layer, wherein the first opening exposes a portion of the substrate and the N-well;

performing a field opening in the silicon nitride layer in the opening, wherein a portion of the field oxide is located on the substrate and the other portion is located on the N-well;

removing the silicon nitride layer and the pad oxide layer;

forming a gate oxide layer, a gate conductive layer, and an electrical field shield conductive layer over the substrate, wherein a portion of the gate conductive layer is located on the field oxide layer, the electrical field shield conductive layer is electrically coupled with the gate conductive layer and is formed from the same structural layer of the gate conductive layer, an the electrical field shield conductive layer is used as an electrical field shield under high voltage, and the electrical field shield conductive layer is located on the field oxide layer without the N-well below;

performing a first P-type ion implantation to form a P-doped region in the substrate, wherein a portion of the P-doped layer is below the gate conductive layer;

performing a third N-type ion implantation to form an N$^+$ drain region in the N-well and an N$^+$ source region in the P-doped region;

performing a second P-type ion implantation to form a P$^+$-doped layer in the P doped layer, wherein the P$^+$-doped layer is beside the N$^+$ source region;

forming a isolation layer having a second opening and a third opening therein over the substrate; and forming a first conductive layer and a second conductive layer over the substrate, wherein the first conductive layer and the second conductive layer are formed from the same structural layer, the second opening is filled by the first conductive layer, the first conductive layer bridges over the field oxide layer having an electrical field shield conductive thereon and without the N-well below, and the third opening is filled by the second conductive layer.

9. The method of claim 8, wherein the substrate is one selected from the group consisting of a P-type silicon substrate and a P-well.

10. The method of claim 8, wherein the step of the first N-type ion implantation further includes driving in a first-type impurity.

11. The method of claim 8, wherein the step of the first P-type ion implantation further includes driving in a third-type impurity.

12. The method of claim 8, wherein the step of the second P-type ion implantation further includes annealing.

13. The method of claim 8, wherein the gate conductive layer and the electrical field shield conductive layer include a doped polysilicon layer.

14. A method of fabricating a high-voltage lateral double-diffused metal oxide semiconductor, wherein the method comprises:

providing a substrate having a first oxide layer thereon;

performing a first P-type ion implantation to form a first P-well in the substrate;

performing a second P-type on implantation to form a second P-well in the substrate;

removing the first oxide layer;

forming a pad oxide layer and a silicon nitride layer over the substrate;

forming a first opening in the pad oxide layer and the silicon nitride layer, wherein the first opening exposes a portion of the substrate, the first P-well; and the second P-well;

performing a field oxidation to form a field oxide layer in the opening, wherein a portion of the field oxide is located on the substrate and the other portion is located on the first P-well and the second P-well;

removing the silicon nitride layer and the pad oxide layer;

forming a gate oxide layer, a gate conductive layer, and an electrical field shield conductive layer over the substrate, wherein a portion of the gate conductive layer is located on the field oxide layer, the electrical field shield conductive layer is electrically coupled with the gate conductive layer and is formed from the same structural layer of the gate conductive layer, the electrical field shield conductive layer is used as an electrical field shield under high voltage, and the electrical field shield conductive layer is located on the field oxide layer without the first P-well and the second P-well below;

performing a first N-type ion implantation to form an N-doped region in the substrate, wherein a portion of the P-doped layer is below the gate conductive layer;

performing a third P-type ion implantation to form a P$^+$ drain region in the second P-well and a P$^+$ source region in the N-doped region;

performing a second N-type ion implantation to form an N$^+$-doped layer in the N-doped layer, wherein the N$^+$-doped layer is beside the P$^+$ source region;

forming a isolation layer having a second opening and a third opening therein over the substrate; and forming a first conductive layer and a second conductive layer over the substrate, wherein the first conductive layer and the second conductive layer are formed from the same structural layer, the second opening is filled by the first conductive layer, and the first conductive layer bridges over the field oxide layer having the electrical field shield conductive thereon and without the first P-well below, and the third opening is filled by the second conductive layer.

15. The method of claim 14, wherein the substrate is one selected from the group consisting of an N-type silicon substrate and an N-well.

16. The method of claim 14, wherein the step of the first P-type ion implantation further includes during in a first-type impurity.

17. The method of claim 14, wherein the step of the second P-type ion implantation further includes driving in a second-type impurity.

18. The method of claim 14, wherein the step of the first N-type ion implantation further includes driving in a third-type impurity.

19. The method of claim 14, wherein the step of the second N-type ion implantation further includes annealing.

20. The method of claim 14, wherein the gate conductive layer and the electrical field shield conductive layer include a doped polysilicon layer.

21. A method of fabricating a high-voltage lateral double-diffused metal oxide semiconductor, wherein the method comprises:

providing a substrate having a first oxide layer thereon;

performing a P-type ion implantation to form a P-well in the substrate;

removing the first oxide layer;

forming a pad oxide layer and a silicon nitride layer in sequence on the substrate;

forming a first opening in the pad oxide layer and the silicon nitride layer, wherein the first opening exposes a portion of the substrate and the P-well;

performing a field oxidation to form a field oxide layer in the opening, wherein a portion of field oxide is located on the substrate and the other portion is located on the P-well;

removing the silicon nitride layer and the pad oxide layer;

forming a gate oxide layer, a gate conductive layer, and an electrical field shield conductive layer over the substrate, wherein a portion of the gate conductive layer is located on the field oxide layer, the electrical field shield conductive layer is electrically coupled with the gate conductive layer and is formed from the same structural layer with the gate conductive layer, the electrical field shield conductive layer is used as an electrical field shield under high voltage, and the electrical field shield conductive layer is located on the field oxide layer and without the P-well below;

performing a first N-type ion implantation to form an N-doped region in the substrate, wherein a portion of the P-doped layer is below the gate conductive layer;

performing a third P-type ion implantation to form an N$^+$ drain region in the P-well and a P$^+$ source region in the N-doped region;

performing a second N-type ion implantation for form an N$^+$-doped layer in the N-doped layer, wherein the P$^+$-doped layer is beside the P$^+$ source region;

forming a isolation layer having a second opening and a third opening therein over the substrate; and forming a first conductive layer and a second conductive layer over the substrate, wherein the first conductive layer and the second conductive layer are formed from the same structural layer, the second opening is filled by the first conductive layer, the first conductive layer bridges over the field oxide layer having a electrical field shield conductive thereon and without the N-well below, and the third opening is filled by the second conductive layer.

22. The method of claim 21, wherein the material for forming the substrate is one selected from the group consisting of an N-type silicon substrate and an N-well.

23. The method of claim 21, wherein the step of the first P-type ion implantation further includes driving in a first-type impurity.

24. The method of claim 21, wherein the step of the first N-type ion implantation further includes driving in a third-type impurity.

25. The method of claim 21, wherein the step of the second N-type ion implantation further includes annealing.

26. The method of claim 21, wherein the gate conductive layer and the electrical field shield conductive layer include a doped polysilicon layer.

\* \* \* \* \*